United States Patent
Besser et al.

(10) Patent No.: US 6,992,004 B1
(45) Date of Patent: Jan. 31, 2006

(54) IMPLANTED BARRIER LAYER TO IMPROVE LINE RELIABILITY AND METHOD OF FORMING SAME

(75) Inventors: Paul R. Besser, Sunnyvale, CA (US); Matthew S. Buynoski, Palo Alto, CA (US); Minh Q. Tran, Milpitas, CA (US); Pin-Chin Connie Wang, Menlo Park, CA (US); Lu You, San Jose, CA (US); Sergey D. Lopatin, Santa Clara, CA (US); Jeremias D. Romero, Hayward, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 330 days.

(21) Appl. No.: 10/209,060

(22) Filed: Jul. 31, 2002

(51) Int. Cl.
*H01L 21/44* (2006.01)

(52) U.S. Cl. .................. 438/653; 438/678; 438/658; 438/637; 438/687; 438/659

(58) Field of Classification Search ........... 438/653, 438/678, 658, 637, 687, 659
See application file for complete search history.

(56) References Cited

U.S. PATENT DOCUMENTS

| | | | | |
|---|---|---|---|---|
| 5,882,738 A | * | 3/1999 | Blish et al. | 427/526 |
| 6,071,807 A | * | 6/2000 | Watanabe et al. | 438/623 |
| 6,096,648 A | * | 8/2000 | Lopatin et al. | 438/687 |
| 6,117,770 A | * | 9/2000 | Pramanick et al. | 438/659 |
| 6,500,749 B1 | * | 12/2002 | Liu et al. | 438/618 |
| 6,589,874 B2 | * | 7/2003 | Andricacos et al. | 438/694 |
| 6,642,623 B2 | * | 11/2003 | McTeer | 257/762 |
| 6,703,307 B2 | * | 3/2004 | Lopatin et al. | 438/653 |
| 2002/0076925 A1 | * | 6/2002 | Marieb et al. | 438/678 |
| 2003/0104692 A1 | * | 6/2003 | Hau-Riege et al. | 438/658 |
| 2003/0194857 A1 | * | 10/2003 | Hau-Riege et al. | 438/637 |

* cited by examiner

*Primary Examiner*—David Zarneke
*Assistant Examiner*—Igwe U. Anya
(74) *Attorney, Agent, or Firm*—Foley & Lardner LLP

(57) ABSTRACT

A method for manufacturing an integrated circuit having improved electromigration characteristics includes forming an aperture in an interlevel dielectric layer and providing a barrier layer in the aperture. The aperture is filled with a metal material and a barrier layer is provided above the metal material. An intermetallic region can be formed at an interface of the metal material and the barrier layer. The intermetallic material can be formed by implantation of species.

29 Claims, 5 Drawing Sheets

IMPLANTED BARRIER LAYER TO IMPROVE LINE RELIABILITY AND METHOD OF FORMING SAME

FIELD OF THE INVENTION

The present invention relates generally to integrated circuits and methods of manufacturing integrated circuits. More particularly, the present invention relates to conductive lines and reduction of electromigration.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of IC devices on an IC, there is still a need to decrease the size of IC device features, and, thus, increase the number of devices on an IC. Nevertheless, there are many factors that make the continued miniaturization of ICs difficult. For example, as the size of vias (or pathways between integrated circuit layers used to electrically connect separate conductive layers) decreases, electrical resistance increases.

Conventional integrated circuits utilize conductive vias and conduct lines to connect structures (e.g., gates, drain regions, source regions) and other conductive lines. A conductive via is typically a metal or conductive plug which extends through an insulative or semiconductor layer. A barrier layer is used to reduce diffusion and electromigration in the via and conductive lines. Electromigration is the mass transport due to momentum exchange between conducting electrons and diffusing metal atoms. Electromigration causes progressive damage to the metal conductors in an integrated circuit. In general, it is characteristic of metals at very high current density and temperatures of 100° C. or more.

Electromigration failures have been described by Stanley Wolf, Ph.D. in *Silicon Processing for the VLSI Era*, Lattice Press, Sunset Beach, Calif., Vol. 2, pp. 264–65 (1990). Dr. Wolf explains that a positive divergence of the motion of the ions of a conductive line leads to an accumulation of vacancies, forming voids in the metal. Such voids may ultimately grow to a size that results in open-circuit failure of the conductive line.

According to one conventional metal layer design, the metal layer (e.g., metal 1, metal 2, etc.) includes conductive lines and dielectric material. The conductive lines are situated in the dielectric material and are connected to conductive vias extending to the substrate and other metal layers. The conductive lines and conductive vias can include copper to achieve the advantage of reduced resistivity.

Copper conductive lines can be formed according to a damascene process. The damascene process forms trenches in the dielectric material associated with the metal layers. The walls of the trenches are covered with a barrier material and copper seed layer is deposited over the barrier material. The copper seed layer provides an active surface region for enhancing adhesion of the copper to the barrier layer. The remainder of the trenches is filled with copper to complete the conductive lines.

After the trench is filled, the copper conductive line as well as the dielectric material is covered with a barrier layer. A dielectric layer (e.g., an interlevel dielectric layer (ILD)) is provided over the barrier layer to isolate the metal layer from other layers.

Conventional damascene processes often fill the trench by electroplating the copper seed layer. According to such a process, copper ions are electrically attracted to the surface of the seed layer during deposition by electroplating. The copper seed layer generally does not reduce or eliminate copper diffusion during electromigration because it is made of the same material as the copper conductive line.

Generally, the barrier material is a nitride material, such as silicon nitride ($SiN_x$). One conventional form of suitable barrier material is $Si_3N_4$ deposited by chemical vapor deposition (CVD). The interface between the barrier material above the conductive line and the dielectric layer (the ILD) above the barrier layer can be susceptible to metal diffusion and electromigration. This susceptibility is particularly important when copper conductive lines are utilized. In addition, adhesion at this interface can be poor.

As conductive lines and barrier layers become smaller, barrier layers have become thinner. Thin barrier layers are desirable to reduce the resistivity of conductive vias. However, thinner barrier layers are more susceptible to electromigration and diffusion issues.

Thus, there is a need for an interface between the conductive line and dielectric layer that is more resistant to copper diffusion and less susceptible to electromigration. Further, there is a need for better adhesion at an interface between the conductive line and the dielectric layer. Even further, there is a need for a method of providing an interface for a copper line and dielectric layer that is less susceptible to electromigration and diffusion problems. Further, there is a need to optimize the barrier layer to increase electromigration resistance. Even further, there is a need for a method of optimizing a silicon nitride barrier layer to have improved resistance to electromigration and diffusion and to provide increased adhesion.

SUMMARY OF THE INVENTION

An exemplary embodiment relates to a method of manufacturing an integrated circuit having improved electromigration characteristics. The method includes steps of forming conductive lines and providing a barrier layer over the conductive line. The method can also include implanting a species into the barrier layer at an interface between the barrier layer and the conductive line. An intermetallic material is formed at the interface due to the implantation of the species.

Another exemplary embodiment relates to a method of fabricating a conductive line or an integrated circuit. The method includes creating an aperture in a dielectric layer, providing a first barrier layer in the aperture; providing a metal layer above the first barrier layer and providing a second barrier layer above the metal layer. The method also includes providing a species into the barrier layer. The species is capable of reacting with the metal layer associated with the conductive line.

Still another exemplary embodiment relates to a method of reducing a metal layer for an integrated circuit. The method includes providing a conductive line above a substrate and depositing a barrier layer above the conductive line. The method also includes implanting the barrier layer to form an intermetallic region at an interface between the barrier layer and the conductive line.

Other principle features and advantages will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF CERTAIN EXEMPLARY EMBODIMENTS

Figure 1:
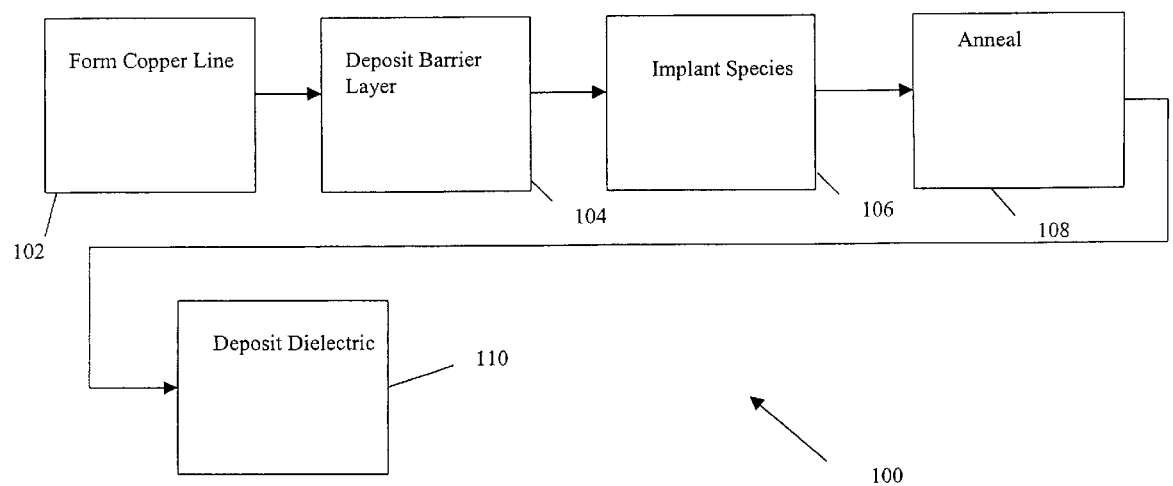
FIG. 1 is a general flow diagram of a process in accordance with an exemplary embodiment of the present invention.

Referring to FIG. 1, a process 100 can be utilized to form a conductive line and insulative or dielectric layer above the conductive line. Process 100 can include a line formation step 102, a barrier layer deposition step 104, a species implantation step 106, an annealing step 108 and a dielectric or insulative layer deposition step 110. Advantageously, process 100 can use implantation (step 106) to optimize an interface between a conductive line and a barrier layer. The interface is optimized to reduce diffusion across it as well as reduce electromigration from the conductive line.

In one embodiment of process 100, a species is implanted at a step 106 which is capable of reacting with the metal in the conductive line to form an intermetallic region. The intermetallic region reduces diffusion across the interface and improves resistance to electromigration. In an alternative embodiment, the species can be chosen to increase adhesion at the interface.

With reference to FIGS. 1–9, an embodiment of process 100 is explained below in accordance with the formation of a metal 1 layer. However, process 100 is applicable to other metal and via formation processes. For example, process 100 can be utilized in any conductive structure.

Figure 2:
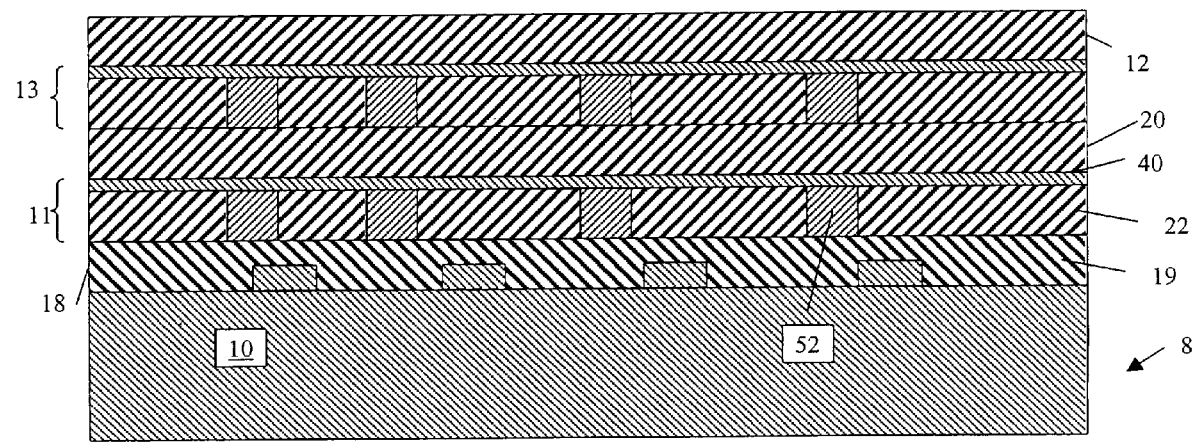
FIG. 2 is a schematic cross-sectional view of a portion of an integrated circuit fabricated in accordance with another exemplary embodiment.

With reference to FIG. 2, an exemplary integrated circuit includes a portion 8. Portion 8 includes two metal layers (metal layers 11 and 13). Although portion 8 is shown with two metal layers, the present disclosure is applicable to an integrated circuit with any number of metal or conductive layers, including a single metal layer or more than five metal layers.

Portion 8 of an integrated circuit (IC) includes a substrate 10. Portion 8 is preferably part of an ultra-large-scale integrated (ULSI) circuit having a million or more transistors. In an exemplary embodiment, portion 8 is manufactured as part of the IC on a semiconductor wafer (e.g., a silicon wafer). Substrate 8 can be any type of IC substrate suitable for building a circuit including conductive lines.

A dielectric layer 18 is disposed above substrate 10 and can cover active devices or portions thereof. The active devices can include transistors, diodes, or other devices. Layer 18 includes dielectric material 19 upon which layer 11 is provided. Layer 18 can be an ILD 0 layer.

Portion 8 also includes a metal layer 11, a metal layer 13, an interlevel dielectric layer 12 (e.g., ILD 1), and an interlevel dielectric layer 20 (e.g., ILD 2).

Interconnect or metal layer 11 includes a barrier layer 40, dielectric material 22, and at least one conductive line 52. Line 52 can be surrounded by a barrier material as explained and shown in more detail below with reference to FIGS. 5–9. Layer 13 is similar to layer 11.

Conductive line 52 can be connected to other conductive lines and conductive vias. Layer 11 may be any type of layer, including at least one conductive line. In one embodiment, layer 11 is a copper interconnect layer (e.g., metal 1, metal 2, etc.). In another embodiment, a conductive via similar to conductive line 52 can connect layer 11 to structures or doped regions on substrate 10 or to layer 13.

Interlevel dielectric layer 20 can be a dielectric layer or can be any of a variety of different materials into which diffusion or migration is undesirable. For example, interlevel dielectric layer 20 may be phosphorous-silicate-glass (PSG), boron-silicate-glass (BSG), silicon dioxide ($SiO_2$), low dielectric constant materials, compound layers of insulative materials, or the like. Interlevel dielectric layer 20 may also include dopant elements, such as, fluorine (F), carbon (C), boron (B), phosphorous (P), silicon (Si), and nitrogen (N).

Conductive line 52 of interconnect layer 11 can include copper (Cu), aluminum (Al), or any other conductive material used for the formation of lines, vias, and the like in an integrated circuit. In an exemplary embodiment, conductive line 52 of metal layer 11 includes copper. In an alternative embodiment, conductive line 52 of interconnect layer 11 includes copper alloys.

Figure 3:
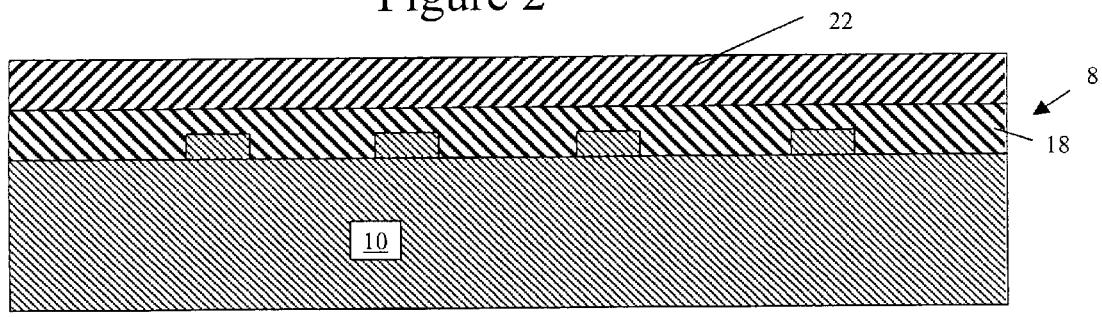
FIG. 3 is a schematic cross-sectional view of the portion shown in FIG. 2, illustrating a dielectric layer deposition step.

With reference to FIG. 3, dielectric material 22 is deposited above interlevel dielectric layer 18 in step 102 (FIG. 1). Layer 22 can be deposited by any conventional process. Preferably, layer 22 includes silicon dioxide and is deposited by chemical vapor deposition (CVD). According to one embodiment, layer 22 is an approximately 5000 Angstroms thick tetraethylorthosilicate (TEOS) deposited silicon dioxide layer.

Figure 4:
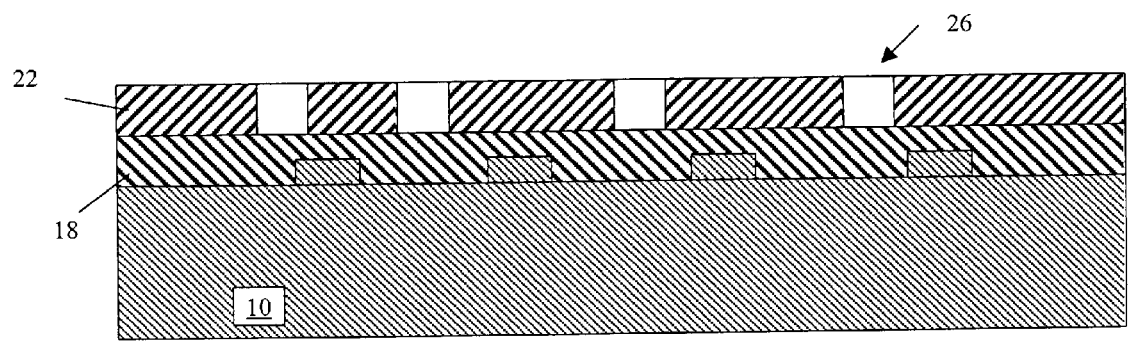
FIG. 4 is a cross-sectional view of the portion shown in FIG. 2, illustrating a trench formation step.

With reference to FIG. 4, a damascene technique is utilized to provide conductive line 52 (FIG. 2) for metal layer 11 in step 102 (FIG. 1). Layer 22 is patterned and etched in a conventional photolithographic process to leave at least one trench 26 for line 52. In a preferred embodiment, a dry etching technique is utilized to form trenches 26. In one embodiment, trench 26 can be approximately 2000 Angstroms wide and is formed by photolithographically patterning a photoresist layer above layer 22.

Figure 5:
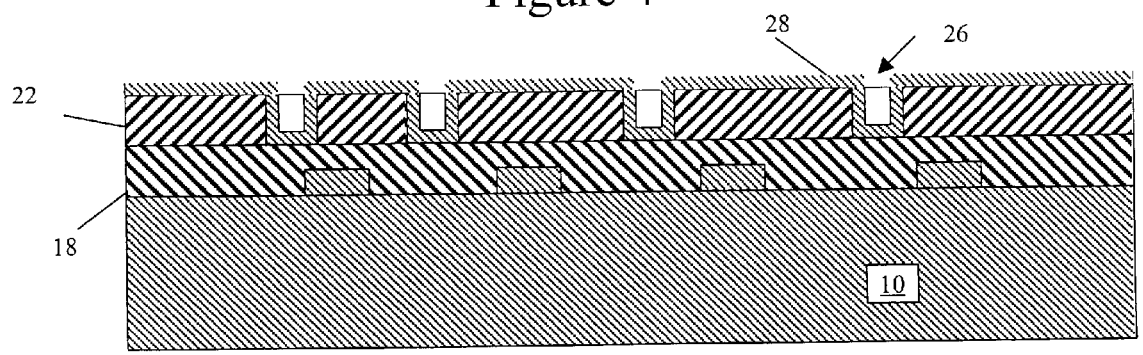
FIG. 5 is a schematic cross-sectional view of the portion shown in FIG. 2, illustrating a barrier layer deposition step.

With reference to FIG. 5, barrier material 28 is deposited in trench 26 in step 102. According to a preferred embodiment, barrier material 28 is deposited to prevent diffusion of material from conductive line 52 (FIG. 2) into layer 22 and layer 18. Barrier material 28 is provided at a bottom of trench 26 and on sidewalls of trench 26 and on the field above dielectric layer 22. Barrier material 28 can be deposited using any of a variety of known methods (e.g., chemical vapor deposition (CVD), physical vapor deposition (PVD), atomic layer deposition (ALD), etc.).

In an exemplary embodiment, barrier material 28 includes tantalum (Ta). Alternative materials for barrier material 28 include one or more of the following: tantalum nitride (TaN), tantalum silicon nitride (TaSiN), titanium nitride (TiN), titanium silicon nitride (TiSiN), tungsten nitride (WNx), tungsten carbon nitride (WCNx), and a tantalum nitride/tantalum stack. Additional alternative materials for barrier material 28 include one or more of the following: silicon carbon nitride (SiCN), silicon oxycarbon nitride (SiCON), disilicon nitride ($Si_2N$), silicon nitride ($Si_3N_4$), or any of a variety of other barrier materials. Additionally, barrier material 28 can include implanted elements, such as boron, phosphorous, silicon, and/or germanium.

In an exemplary embodiment, barrier layer material 28 has a cross-sectional thickness of between approximately 10 and 300 Angstroms. In a preferred embodiment, barrier material 28 has a thickness of between approximately 50 and 100 Angstroms. In an alternative embodiment, barrier material 28 may have a thickness less than approximately 50 Angstroms.

Material 28 can be formed in trench 26 by depositing an approximately 10 to 400 Angstroms thick conformal layer and polishing or etching the conformal layer to remove the conformal layer from the top surface of layer 22. The conformal layer remains in trench 26 as material 28. The conformal layer can be removed in a chemical mechanical polish (CMP) step selective to silicon nitride with respect to silicon dioxide.

In an exemplary embodiment, a seed layer can be provided above barrier material 28. The seed layer can have a thickness of between approximately 500 and 1000 Angstroms. In a preferred embodiment, seed layer has a thickness of between approximately 500 and 700 Angstroms. In alternative embodiments, the thickness of the seed layer may vary depending on various design considerations. For example, the seed layer can have a thickness less than 500 Angstroms (e.g., between approximately 100 and 200 Angstroms). In another alternative embodiment, the seed layer may have a thickness greater than 1000 Angstroms.

One advantageous feature of providing seed and barrier layers having a reduced thickness (e.g., seed and barrier layer having thicknesses of between approximately 100 and 200 Angstroms) is that reducing the thickness of these layers enables production and filling of lines 52 having smaller dimensions. Producing smaller dimension lines may increase the number of transistors that may be formed in the integrated circuit. The seed layer may include a number of layers. In a preferred embodiment, the seed layer is comprised of copper.

Figure 6:
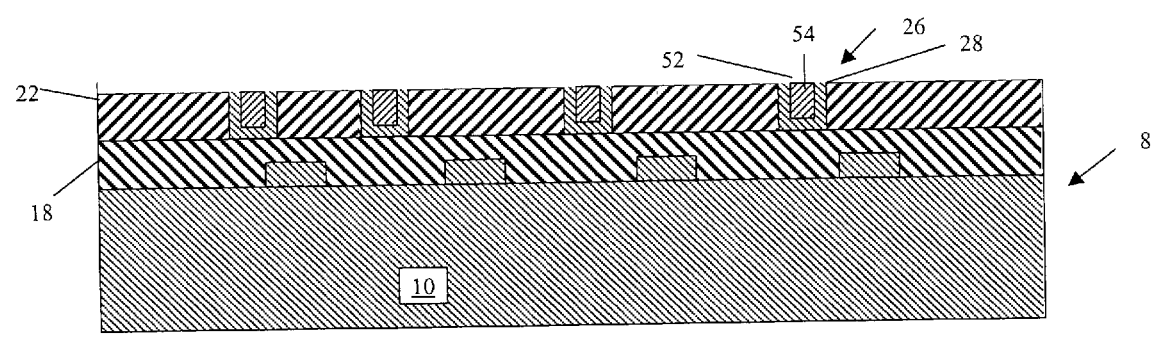
FIG. 6 is a schematic cross-sectional view of the portion shown in FIG. 2, illustrating a metal layer deposition step.

With reference to FIG. 6, the remaining portion of trench 26 is filled with conductive material in step 102 (FIG. 1). In a preferred embodiment, the remaining portion is filled with a copper material 54 to complete conductive line 52. In a preferred embodiment, material 54 is electroplated on the seed layer provided on material 28. Alternatively, other conventional processes can be utilized to fill the remaining portion of trench 26. In an alternative embodiment, an alloy of copper can be utilized as material 54. For example, material 54 can also be deposited by sputter deposition to fill the remaining portion of trench 26. It should be noted that while the step of polishing the conformal layer was described above as taking place prior to providing a seed layer and filling trench 26 with a conductive material, the polishing of the conformal layer may alternatively take place after the seed layer and conductive materials are provided.

Figure 7:
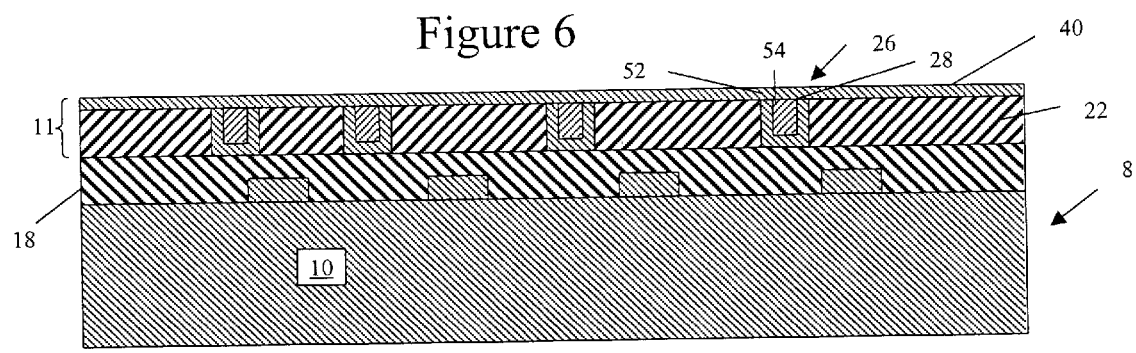
FIG. 7 is a schematic cross-sectional view of the portion shown in FIG. 2, illustrating another barrier layer deposition step.

With reference to FIG. 7, barrier layer 40 is deposited above a top surface of layer 22 and above conductive line 52 in step 104 (FIG. 1). Preferably, barrier layer 40 is deposited by CVD process.

Alternatively, barrier layer 40 can be provided by other deposition or application processes. Barrier layer 40 can be a 100–500 Å thick layer of the same material as barrier material 28. Alternatively, layer 40 can be a different material than material 28. In a preferred embodiment, barrier layer 40 is a silicon nitride ($SiN_x$) material. Exemplary materials for material 28 include silicon nitride ($Si_3N_4$), silicon carbon nitride (SiCN), and silicon oxycarbon nitride (SiCON).

Alternatively, layer 40 can include one or more of the following: tantalum silicon nitride (TaSiN), titanium silicon nitride (TiSiN), disilicon nitride ($Si_2N$), $Si_3N_4$, SiCN, SiCON, or any of a variety of other barrier materials. However, if conductive barrier materials are utilized for layer 40, the material must be appropriately etched in a subsequent step to prevent shorting between conductive lines. In addition, layer 40 can include implanted elements, such as boron, phosphorous, silicon and/or germanium.

Figure 8:
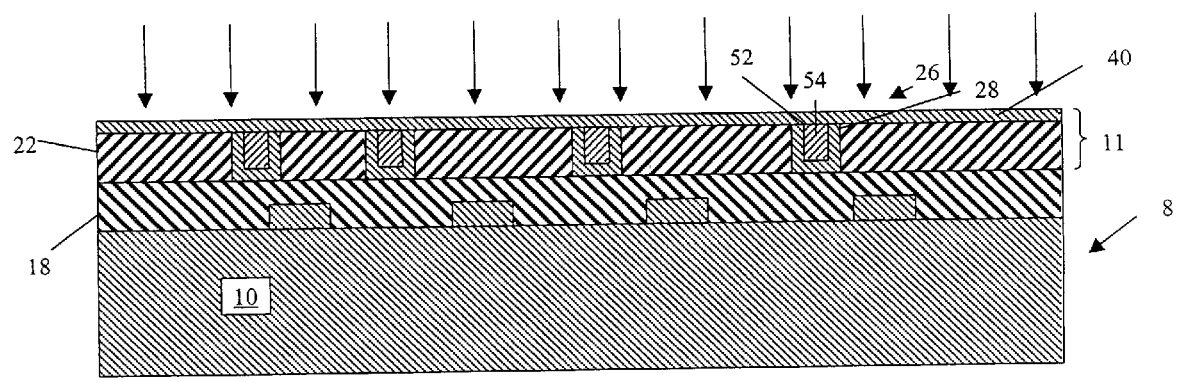
FIG. 8 is a schematic cross-sectional view of a portion of the portion shown in FIG. 2, illustrating an implanting and annealing step.
Figure 9:
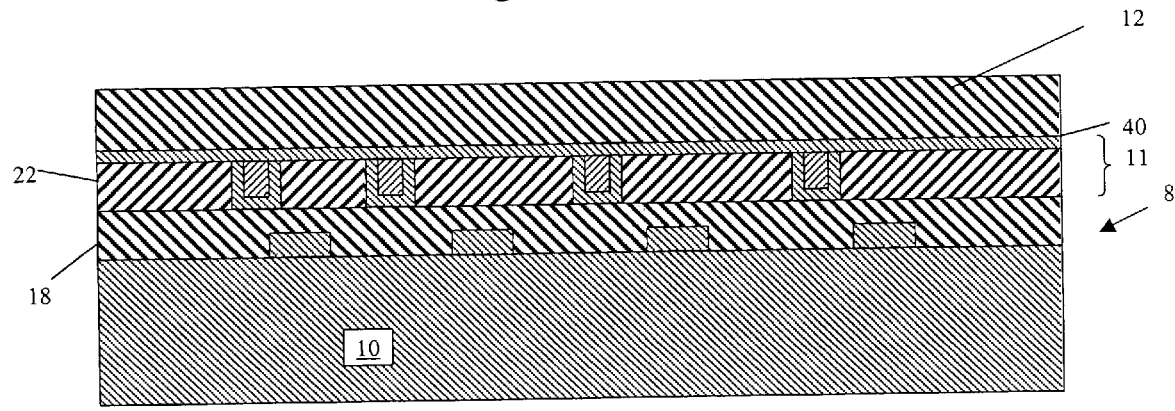
FIG. 9 is a cross-sectional view of the portion shown in FIG. 2, illustrating an interlevel dielectric deposition step.

With reference to FIG. 8, layer 40 is implanted with a species at step 106 (FIG. 1). In a preferred embodiment, layer 40 is implanted with at least one of the following elements to create an intermetallic region between a border between layer 40 and material 54: Cu, Sc, Ti, Sr, Y, Zr, Ba, La, Hf, Cd, S, Se, Te, Ce, Pr, Nd, Pm, Sm, Eu, Gd, Tb, Dy, Ho, Er, Mg, Ti, P, In, Sn, Sb, Th. The intermetallic region advantageously reduces diffusion across the interface and improves electromigration associated with line 52. Preferably, the intermetallic region has a depth of 50 Å–200 Å and has a width of the entire width of line 52.

In one embodiment, layer 40 is implanted using an ion implantation technique in which tin (Sn) type ions are accelerated at an energy of 10 keV and a dose of $5 \times 10^{14}$ atoms/cm$^2$ to layer 40. Layer 40 is preferably implanted at low dose and low energy. Low dose and low energy implants allow the intermetallic region to be partially formed in layer 40. The species or elements can be implanted using ion implantation equipment manufactured by Varian Inc. or Applied Materials, Inc. The depth of the intermetallic region can extend from a top surface of line 52 to a depth of less than 200 Å below the top surface. Alternatively, the intermetallic region can extend from the interface between line 52 and layer 40 to a depth of less than 200 Å below the top surface of line 52.

After step 106, portion 8 is annealed in step 108. Preferably, a furnace type annealing process is utilized. The annealing process assists in the formation of intermetallic regions at the interface of line 52 and layer 40. In an exemplary embodiment, a furnace anneal is performed in a reducing or inert atmosphere at a temperature of between approximately 200 and 400° C. for approximately 30 minutes.

System parameters and design criteria can affect conditions associated with the implantions of species and formations of the intermetallic layer. For example, material choices for layer 40 and material 54 can affect the required dosages, implantation energies and anneal parameters. Similarly, thicknesses for those layers can also affect processing parameters. Changes to the various exemplary process and parameters given can be made without departing from the scope of the claims. The intermetallic region is generally a layer of alloy formation between material 54 (preferably, Cu) and the implanted species (preferably, Sn).

With reference to FIG. 8 at step 110 (FIG. 1), dielectric layer 12 is provided above layer 40. Dielectric layer 12 can be provided by a process similar to the formation of layer 18.

With reference to FIG. 2, metal layer 13 can be manufactured in a similar process to the process described above with respect to metal layer 11. The conductive lines of layer 13 can include an advantageous intermetallic region formed by process 100.

While the above exemplary embodiments have been described with regard to a damascene copper metal line process in step 102, other line formation processes can be utilized. For example, line 52 can be fabricated in a dual damascene process. In another alternative, a metal layer for line 52 can be deposited and etched to leave line 52. Line 52 can thereafter be covered by dielectric material to complete layer 11.

While the exemplary embodiments illustrated in the FIGURES and described above are presently preferred, it should be understood that these embodiments are offered by way of example only. Other embodiments may include, for example, different methods of depositing the various layers above the substrate different combinations of annealing times, implantation parameters and temperatures, and the like. The invention is not limited to a particular embodiment, but extends to various modifications, combinations, and permutations that nevertheless fall within the spirit and scope of the appended claims.

What is claimed is:

1. A method of manufacturing an integrated circuit having improved electromigration characteristics, the method comprising steps of:
   forming conductive lines;
   providing a barrier layer over the conductive line; and
   implanting species into the barrier layer at an interface between the barrier layer and the conductive line; and
   annealing to cause the implanted species in the barrier layer to react with the conductive line to form an intermetallic material at the interface.

2. The method of claim 1, wherein the barrier layer includes silicon nitride.

3. The method of claim 2, wherein the conductive line includes copper.

4. The method of claim 3, wherein the species comprises at least one material selected from the group consisting of Cu, Sc, Ti, Sr, Y, Zr, Ba, La, Hf, Cd, S, Se, Te, Ce, Pr, Nd, Pm, Sm, Eu, Gd, Tb, Dy, Ho, Er, Mg, Ti, P, In, Sn, Sb, and Th.

5. The method of claim 2, wherein the barrier layer is between approximately 10 and 150 Angstroms thick.

6. The method of claim 5, wherein the species are provided by ion implantation.

7. The method of claim 2, wherein the conductive line is formed in a dual damascene process.

8. The method of claim 1, where in the conductive line is formed in a damascene process.

9. The method of claim 1, further comprising providing a mask before the implanting step.

10. The method of claim 1, wherein the annealing step is performed at a temperature between approximately 200° C. and 400° C.

11. The method of claim 10, wherein the annealing step assists in forming the intermetallic material.

12. The method of claim 1, wherein the species comprise at least one material selected from the group consisting of Cu, Sc, Ti, Sr, Y, Ba, La, Hf, Cd, S, Se, Te, Ce, Pr, Nd, Pm, Sm, Eu, Gd, Tb, Dy, Ho, Er, Ti, P, In, Sb, and Th.

13. The method of claim 1, wherein the barrier layer is selected from the group consisting of tantalum nitride, tantalum silicon nitride, titanium nitride, titanium silicon nitride, tungsten nitride, tungsten carbon nitride, silicon carbon nitride, silicon oxycarbon nitride, disilicon nitride, silicon nitride, and a tantalum nitride/tantalum stack.

14. A method of fabricating a conductive line for an integrated circuit, the method comprising:
   creating an aperture in a dielectric layer;
   providing a first barrier layer in the aperture;
   providing a metal layer above the first barrier layer;
   providing a second barrier layer above the metal layer; and
   providing species into the second barrier layer and annealing at a temperature such that the species provided in the second barrier layer react with the metal layer associated with the conductive line.

15. The method of claim 14, wherein the annealing temperature is between approximately 200° C. and 400° C.

16. The method of claim 15, further comprising:
   providing an interlevel dielectric above the second barrier layer.

17. The method of claim 15, wherein the annealing step assists in the reaction between the species provided in the second barrier layer and the metal layer associated with the conductive line.

18. The method of claim 14, wherein the metal layer is copper.

19. The method of claim 18, wherein the second barrier layer is silicon nitride.

20. The method of claim 19, wherein the species include at least one material selected from the group consisting of Cu, Sc, Ti, Sr, Y, Zr, Ba, La, Hf, Cd, S, Se, Te, Ce, Pr, Nd, Pm, Sm, Eu, Gd, Tb, Dy, Ho, Er, Mg, Ti, P, In, Sn, Sb, and Th.

21. The method of claim 14, wherein the species comprise at least one material selected from the group consisting of Cu, Sc, Ti, Sr, Y, Ba, La, Hf, Cd, S, Se, Te, Ce, Pr, Nd, Pm, Sm, Eu, Gd, Tb, Dy, Ho, Er, Ti, P, In, Sb, and Th.

22. The method of claim 14, wherein the second barrier layer is selected from the group consisting of tantalum nitride, tantalum silicon nitride, titanium nitride, titanium silicon nitride, tungsten nitride, tungsten carbon nitride, silicon carbon nitride, silicon oxycarbon nitride, disilicon nitride, silicon nitride, and a tantalum nitride/tantalum stack.

23. A method of producing metal layer an integrated circuit, the method comprising:
   providing a conductive line above a substrate;
   depositing a barrier layer above the conductive line; and
   implanting the barrier layer with a first material and annealing to form an intermetallic region at an interface between the barrier layer and the conductive line;
   wherein the intermetallic region is an alloy comprising the first material implanted in the barrier layer and a second material used to form the conductive line.

24. The method of claim 23, wherein the barrier layer is implanted with at least one of: Cu, Sc, Ti, Sr, Y, Zr, Ba, La, Hf, Cd, S, Se, Te, Ce, Pr, Nd, Pm, Sm, Eu, Gd, Tb, Dy, Ho, Er, Mg, Ti, P, In, Sn, Sb, Th.

25. The method of claim 24, wherein the annealing is performed at a temperature of between approximately 200° C. and 400° C.

26. The method of claim 25, wherein the barrier layer is silicon nitride.

27. The method of claim 25, wherein the annealing step assists in forming the intermetallic region.

28. The method of claim 23, wherein the barrier layer is implanted with at least one material selected from the group consisting of Cu, Sc, Ti, Sr, Y, Ba, La, Hf, Cd, S, Se, Te, Ce, Pr, Nd, Pm, Sm, Eu, Gd, Tb, Dy, Ho, Er, Ti, P, In, Sb, and Th.

29. The method of claim 23, wherein the barrier layer is selected from the group consisting of tantalum nitride, tantalum silicon nitride, titanium nitride, titanium silicon nitride, tungsten nitride, tungsten carbon nitride, silicon carbon nitride, silicon oxycarbon nitride, disilicon nitride, silicon nitride, and a tantalum nitride/tantalum stack.

* * * * *